United States Patent
Fujiwara et al.

(10) Patent No.: US 6,218,230 B1
(45) Date of Patent: Apr. 17, 2001

(54) METHOD FOR PRODUCING CAPACITOR HAVING HEMISPHERICAL GRAIN

(75) Inventors: Shuji Fujiwara; Toshiyuki Hirota, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/190,023

(22) Filed: Nov. 12, 1998

(30) Foreign Application Priority Data

Nov. 11, 1997 (JP) .................................................. 9-308787

(51) Int. Cl.$^7$ .............................................. H01L 21/8234
(52) U.S. Cl. .............................. 438/238; 438/398; 437/52
(58) Field of Search .................................... 438/398, 253, 438/255, 396, 964, 665, 238, 261; 437/52, 60, 47, 919, 48

(56) References Cited

U.S. PATENT DOCUMENTS

| 5,418,180 | 5/1995 | Brown ..................................... 437/60 |
| 5,418,388 | 5/1995 | Okudaira et al. ..................... 257/295 |
| 5,478,769 | * 12/1995 | Lim ........................................ 437/52 |
| 5,608,247 | 3/1997 | Brown ................................... 257/306 |
| 5,663,085 | 9/1997 | Tanigawa .............................. 438/255 |
| 5,858,852 | * 1/1999 | Aiso ...................................... 438/396 |
| 5,910,019 | 6/1999 | Watanabe et al. ................... 438/488 |
| 5,989,969 | 11/1999 | Watanabe et al. ................... 438/381 |
| 6,004,859 | * 12/1999 | Lin ........................................ 438/398 |

FOREIGN PATENT DOCUMENTS

| 6-204426 | 7/1994 | (JP) . |
| 7-14993 | 1/1995 | (JP) . |
| 7-335842 | 12/1995 | (JP) . |
| 8-298312 | 11/1996 | (JP) . |
| 8-306646 | 11/1996 | (JP) . |

* cited by examiner

Primary Examiner—David Nelms
Assistant Examiner—Phuc T. Dang
(74) Attorney, Agent, or Firm—Foley & Lardner (57) ABSTRACT

A first amorphous silicon layer is formed to connect to a portion of a capacitor contact plug, and then a second amorphous silicon layer and a third amorphous silicon layer are formed thereon. The first and the third amorphous silicon layers are formed so that they have a lower impurity concentration than that in the second amorphous silicon layer. HSG (hemispherical grain) is grown on surfaces of the first and the third amorphous silicon layers, and subsequently an impurity is diffused from the second amorphous silicon layer to the HSG. In such a method for producing a capacitor, the size of the HSG can be appropriately and uniformly controlled, and depletion in the HSG is prevented.

22 Claims, 6 Drawing Sheets

METHOD FOR PRODUCING CAPACITOR HAVING HEMISPHERICAL GRAIN

BACKGROUND OF THE INVENTION

1. Field of the Invention

The present invention relates to a method for producing a capacitor, and in particular to a method for producing a capacitor in which hemispherical grain (HSG) is formed on the surface of its lower electrode.

2. Related Art

A stacked capacitor using an amorphous silicon film as an electrode has widely been used as a DRAM cell from 1 MB DRAM times to the present time. However, in its conventional structure, it is becoming difficult to keep its capacitance sufficient by reduction in cell size accompanying a rise in integration degree. Thus, methods for increasing the surface area of a lower electrode (the area opposite to an upper electrode) effectively have been studied, for example, a method of making the lower electrode into a cylindrical form, or a method of forming HSG on the surface of the electrode.

Figure 3:
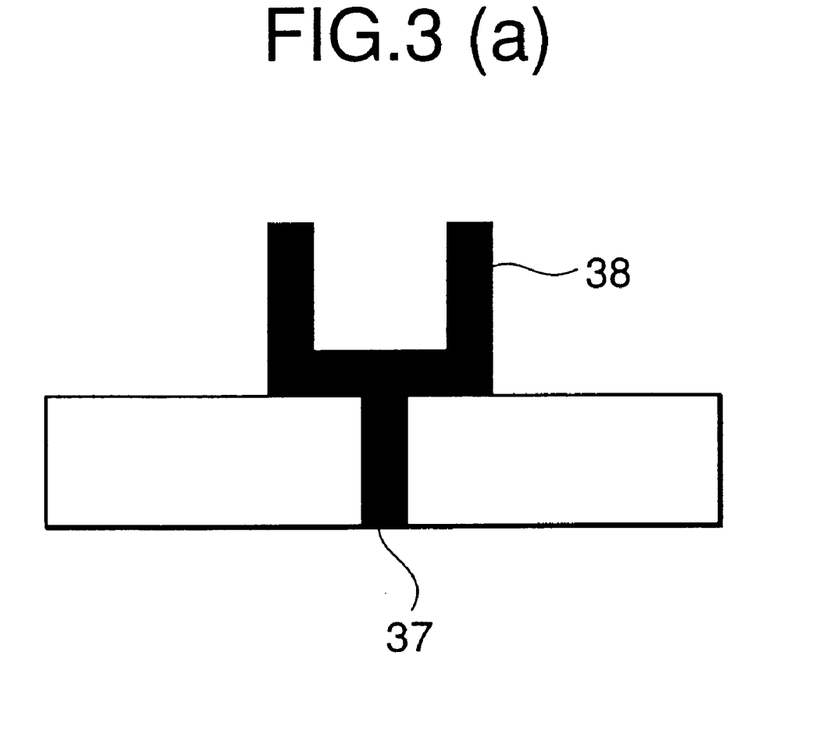
FIGS. 3(a) and 3(b) are schematic cross sections of steps in a conventional method for producing a capacitor.
Figure 4:
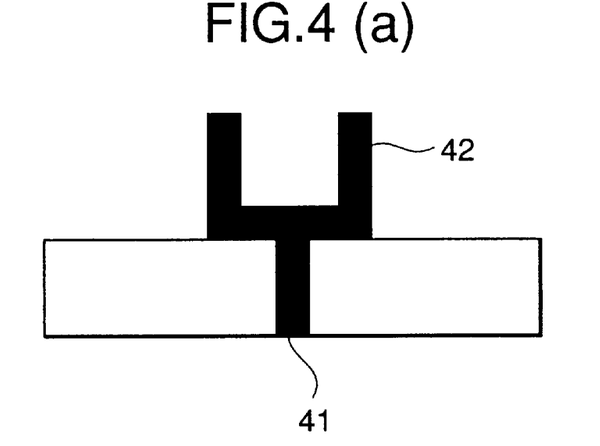
FIGS. 4(a) to 4(c) are schematic cross sections of steps in a conventional method for producing a capacitor.

Conventional examples of methods for producing such a capacitor are shown in FIGS. 3 and 4.

An example of a method for producing a cylindrical stacked capacitor is shown in FIGS. 3(a) and 3(b). First, a phosphorus-doped amorphous silicon layer 38 is grown so that it connects to a drain area (not illustrated) through a node contact hole 37, and then this layer is etched to be into a cylindrical form (FIG. 3(a)). Thereafter, its surface is irradiated with a silicon molecule beam or the like to form nuclei for HSG growth, and the resultant is annealed to grow HSG 39 (FIG. 3(b)), causing formation of a lower electrode.

Another example of a method for producing a capacitor having a step to deposit a double-layer film is shown in FIGS. 4(a) to 4(c). First, a phosphorus-doped amorphous silicon layer 42 is grown so that it connects to a drain area (not illustrated) through a node contact hole 41, and then this layer is etched to be into a cylindrical form (FIG. 4(a)). Subsequently, a non-doped silicon layer 43 is grown on the entire surface thereof (FIG. 4(b)). Next, using this non-doped silicon layer as a base, a silicon molecular beam is applied to this layer, to form nuclei for HSG growth, and then annealing treatment is carried out to form HSG 44. Thereafter, the resultant is subjected to etch back treatment to isolate a stack electrode, and then is subjected to annealing treatment to form a lower electrode (FIG. 4(c)).

In the first prior art, the lower electrode is in a cylindrical form. Thus, the absolute amount of the impurity is liable to become insufficient and after formation of the HSG the impurity of a sufficient concentration is not diffused into the grown HSG portions, causing the problem of depletion easily. In order to avoid this problem of depletion, it is necessary to raise the impurity concentration in the doped silicon layer, which is a base for formation of the HSG. In this case, however, the growth rate of the HSG drops. In particular, if the impurity concentration is made higher than a given level, the problem arises that the HSG is hardly formed. This would probably be because phosphorus is precipitated on the surface of the doped silicon, not permitting surface migration of silicon. Besides, there is room for improvement, from the standpoint that parameters for deciding density and size of the HSG cannot be sufficiently freely selected.

In the second prior art, a non-doped silicon layer is deposited on the entire surface of a phosphorus-doped silicon layer and, consequently, it is necessary that after the growth of HSG etch back treating is carried out for separation of respective electrodes. At this time, the most serious problem arises that the HSG and the cylindrical portion itself are damaged. If the non-doped silicon layer is selectively formed, the etch back treatment is unnecessary. In this case, however, the problem arises that the thickness of the non-doped silicon layer is limited. Specifically, if the thickness of the film becomes large, selectivity is lost in growth of the non-doped silicon layer, causing a short circuit between electrodes. For this reason, it is necessary that the layer thickness is usually 15 nm or less. Therefore, HSG having a sufficient size may not be obtained.

SUMMARY OF THE INVENTION

To overcome the aforementioned problems in producing a lower electrode whose surface has HSG, an object of the present invention is to realize a capacitor having a high capacitance by controlling the size of the HSG appropriately and uniformly and preventing depletion of impurities.

The method for producing a capacitor of the present invention comprises the step of forming a first amorphous silicon layer; the step of forming a second amorphous silicon layer on the first amorphous silicon layer; and the step of growing hemispherical grain (HSG) on a surface of the second amorphous silicon layer, using the first amorphous silicon layer as a stopper of the growth.

Since the first amorphous silicon layer functions as a stopper for preventing the HSG from growing up to undesirably larger size, the shape of the HSG can be kept satisfactory.

Furthermore, by making the impurity concentration in the first amorphous silicon layer lower than that in the second amorphous silicon layer, the second amorphous silicon layer becomes a source for supplying silicon for the HSG growth, and the first amorphous silicon layer becomes a source for supplying an impurity for giving conductivity to the HSG, causing the growth rate of the HSG to be improved. In addition, the HSG having good property can be formed since the impurity can easily diffuse into the HSG.

PREFERRED EMBODIMENTS OF THE INVENTION

The following will describe embodiments of the present invention, referring to the drawings.

Referring to FIGS. 1(a) to 1(f), first an element isolation film 3 and a gate oxide film were selectively deposited on a surface of a P-type silicon substrate 1, and plural gate electrodes 4 which also functioned as word lines were formed. Furthermore, plural N-type diffusion layer areas 2 were formed. Next, an interlayer dielectric was formed on the entire surface thereof, and then bit lines connecting to source areas was formed. Furthermore, an interlayer dielectric was formed on the entire surface thereof. Subsequently, node contact holes reaching drain areas were formed, and through the node contact holes N-type doped amorphous silicon connecting to the diffusion layer areas 2 was grown. Etch back treatment was then carried out to form capacitor contact plugs 6. Thereafter, on the entire surface, silicon nitride 7 of 40 nm thickness, a boron phosphosilicate glass (BPSG) 8 of 800 nm thickness, and a non-doped silicate glass (NSG) 9 of 50 nm thickness were grown (FIG. 1(a)).

Figure 1:
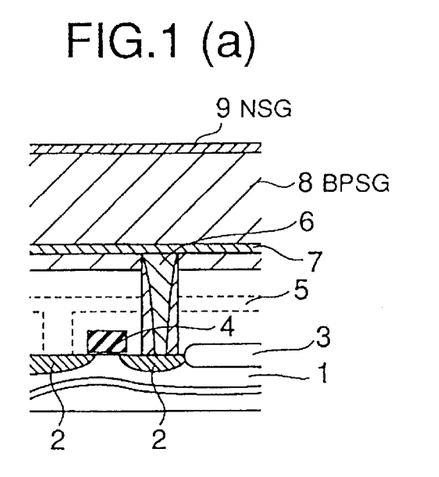
FIGS. 1(a) to 1(f) are schematic cross sections of steps in a first embodiment of the method for producing a capacitor according to the present invention.

Next, given portions of the silicon nitride 7, the BPSG 8 and the NSG 9 were etched to expose a portion of the doped amorphous silicon 6 (FIG. 1(b)).

Next, a first amorphous silicon layer 10 was formed to connect to at least one portion of the doped amorphous silicon 6, and then thereon a second amorphous silicon layer 11, and a third amorphous layer 12 were formed in this order (FIG. 1(c)). Herein, the first amorphous silicon layer and the third amorphous silicon layer were made into non-doped silicon layers, and the second amorphous silicon layer was made into a doped silicon layer having a phosphorus concentration of $4.0 \times 10^{20}$ atoms/cm$^3$. Concerning the thickness of the respective layers, the thickness of each of the first and the third amorphous silicon layers was 20 nm, and that of the second amorphous silicon layer was 60 nm. The respective layers were deposited by an LP-CVD method. In forming the first and the third amorphous silicon layers, $SiH_4$ was used as an ingredient gas. In forming the second amorphous silicon layer, $PH_3$ was further added thereto, and a phosphorus concentration was controlled by a partial pressure of $PH_3$.

Subsequently, silica 13 was applied to the third amorphous silicon layer and is annealed at 400° C. (FIG. 1(d)), and then portions of the silica and the first, the second and the third silicon layers were etched and removed off (FIG. 1(e)).

Next, the oxide film was removed and then the nitride film was removed by wet or dry etching, thus exposing at least one portion of the first amorphous silicon layer 10 and at least one portion of the third amorphous silicon layer 12.

Thereafter, portions of the first and the second amorphous silicon layers were converted into a doped polycrystal silicon 14 (HSG) composed of fine hemispherical grain. That is, treatment for forming HSG was performed.

A lower electrode of a stacked capacitor was formed as described above. When the surface of the lower electrode was observed by an electron microscope, it was confirmed that the HSG having a grain size of about 60 nm was formed uniformly and highly densely.

After the formation of the lower electrode in the aforementioned way, a nitride film of 6.5 nm thickness was deposited as a dielectric film by a known LP-CVD method, and then a portion of the nitride film was converted into an oxide film by pyrogenic oxidization at 800° C. for 35 minutes. At this time, phosphorus was diffused into the portions converted into HSG.

Next, a doped silicon film containing $3.0 \times 10^2$ atoms/cm$^3$ of phosphorus as an impurity was deposited as an upper electrode by a known LP-CVD method, to finish a capacitor. It was confirmed that the finished capacitor exhibited suppressed depletion of the impurity and had a sufficient capacitance. In the present embodiment, the lower electrode was connected to the diffusion layer area through the capacitor contact plug 27. However, the capacitor may have a structure wherein a lower electrode is directly connected to a lower electrode-forming area on a substrate.

The following will describe a second embodiment.

First, an element isolation film 23 and a gate oxide film were selectively deposited on a surface of a P-type silicon substrate 21, and plural gate electrodes 24 which also functioned as word lines were formed. Furthermore, plural N-type diffusion layer areas 22 were formed. Next, an interlayer dielectric was formed on the entire surface thereof, and then bit lines connecting to source areas were formed. Furthermore, an interlayer dielectric was formed on the entire surface thereof. Subsequently, node contact holes reaching drain areas were formed, and N-type doped amorphous silicon 28 connecting to drain areas through the node contact holes was grown to form capacitor contact plugs 37. Thereafter, on the entire surface BPSG 29 of 800 nm thickness and NSG 20 of 50 nm thickness were grown (FIG. 2(a)).

Next, given portions of the doped amorphous silicon 28, the BPSG 29 and the NSG 20 were etched to expose a portion of the side faces of the doped amorphous silicon 28 (FIG. 2(b)).

Figure 2:
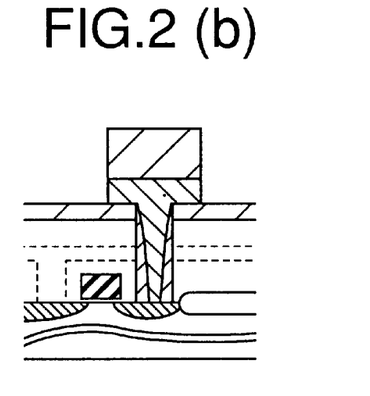
FIGS. 2(a) to 2(f) are schematic cross sections of steps in a second embodiment of the method for producing a capacitor according to the present invention.
Figures 2, 2A:
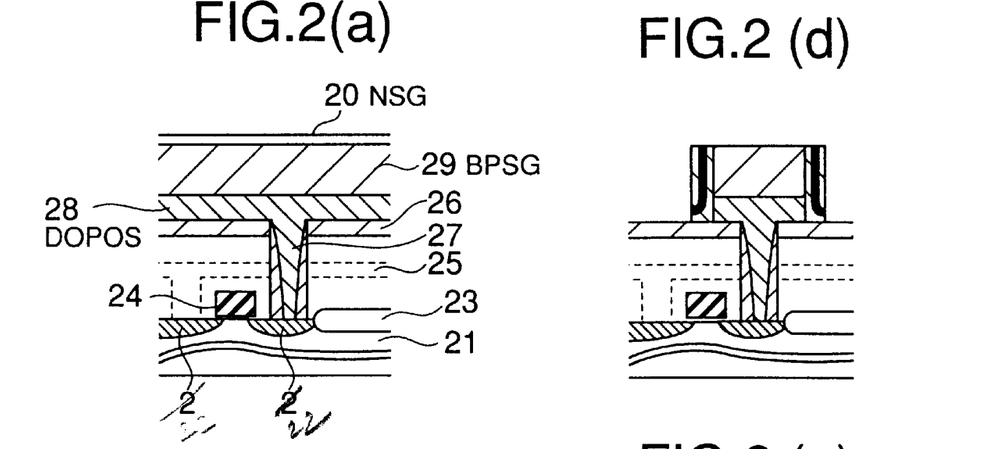

Next, a first amorphous silicon layer 30 was formed to connect to side faces of the doped amorphous silicon 28, and then thereon a second amorphous silicon 31, and a third amorphous 32 were formed in this order (FIG. 2 (c)). Herein, the first amorphous silicon layer and the third amorphous silicon layer were made into non-doped silicon layers, and the second amorphous silicon layer was made into a doped silicon layer. Concerning the thickness of the respective layers, the thickness of each of the first and the third amorphous silicon layers was 20 nm, and that of the second amorphous silicon layer was 60 nm. The respective layers were deposited by an LP-CVD method. In forming the first and the third amorphous silicon layers, $SiH_4$ was used as an ingredient gas. In forming the second amorphous silicon layer, $PH_3$ was further added, and a phosphorus concentration was controlled by a partial pressure of $PH_3$. In the present embodiment, the first amorphous silicon layer and the third amorphous silicon layer were made into non-doped silicon layers, but in case wherein the rate of HSG growth is too fast for control thereof, an impurity having a concentration of, e.g., about $1.0 \times 10^{20}$ atoms/cm$^3$ may be contained in these layers.

Subsequently, portions of the first, the second and the third amorphous silicon layers were etched and removed off (FIG. 2(d)).

Next, the BPSG 29 was removed by using difference between the BPSG 29 and the NSG 26 in their etching rates, thereby exposing at least one portion of the first amorphous silicon layer 30 and at least one portion of the third amorphous silicon layer 32 (FIG. 2(e)).

Thereafter, portions of the first and the third amorphous silicon layers were converted into doped amorphous silicon 34 (HSG) composed of fine hemispherical grain. That is, treatment for forming HSG was performed (FIG. 2(f)).

A lower electrode of a stacked capacitor was formed as described above. When the surface of the lower electrode was observed by an electron microscope, it was confirmed that the HSG having a grain size of about 60 nm was formed uniformly and highly densely.

After the formation of the lower electrode in the aforementioned way, a nitride film of 6.5 nm thickness was deposited as a dielectric film by a known LP-CVD method, and then a portion of the nitride film was converted into an oxide film by pyrogenic oxidization at 800° C. for 35 minutes. At this time, phosphorus was diffused into the portions converted into HSG.

Next, a doped silicon film containing $3.0 \times 10^{22}$ atoms/cm$^3$ of phosphorus as an impurity was deposited as an upper electrode by a known LP-CVD method, to finish a capacitor. It was confirmed that the finished capacitor exhibited suppressed depletion of the impurity and had a sufficient capacitance.

Figure 5:
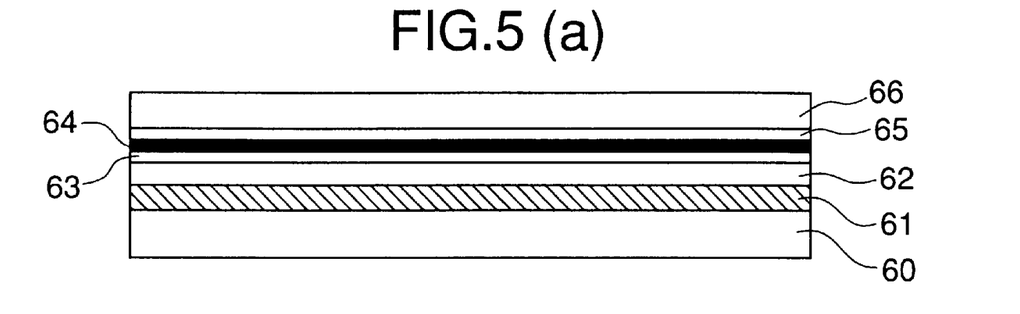
FIGS. 5(a) to 5(d) are schematic cross sections of steps in a third embodiment of the method for producing a capacitor according to the present invention.
Figure 6:
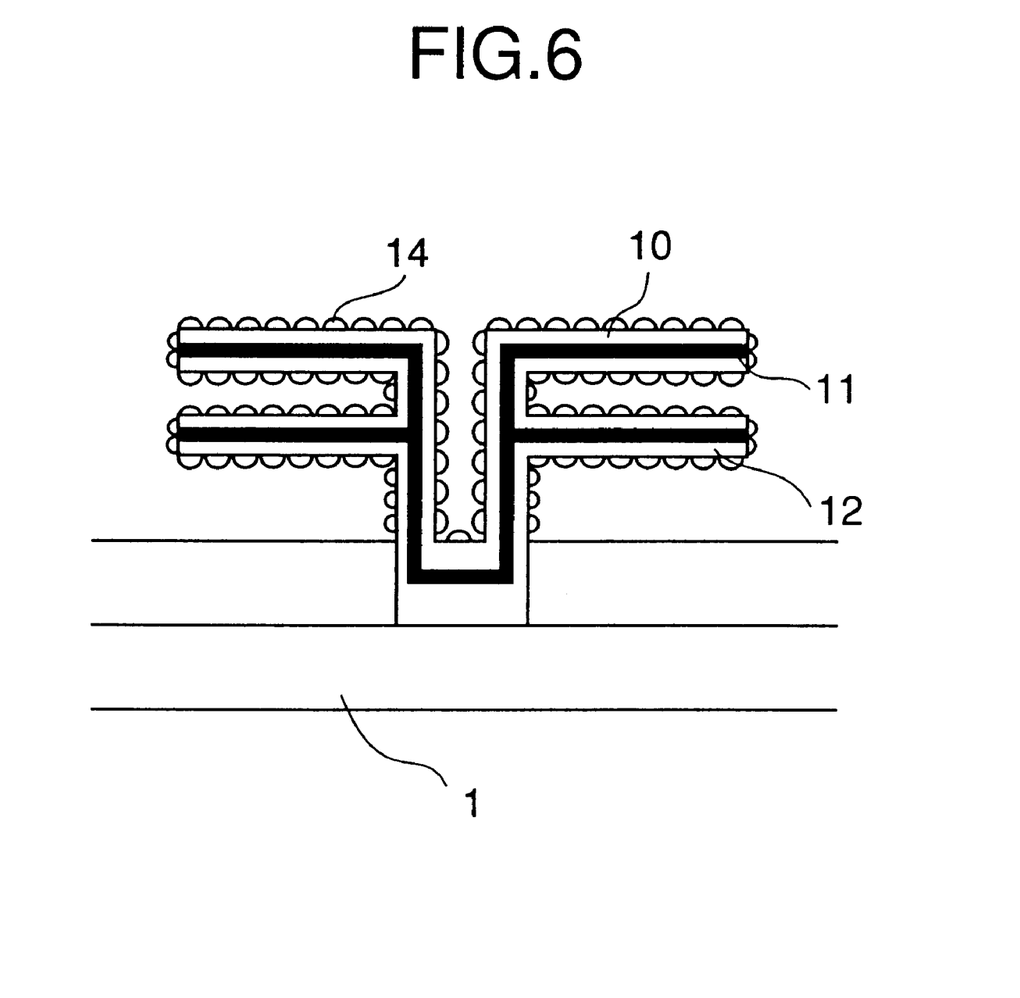
FIG. 6 is a schematic view of a lower electrode having a fin structure.

The following will describe a third embodiment in which the method for producing a capacitor of the present invention is applied to a stacked capacitor in a fin type, referring to FIGS. 5 and 6.

First, an entire surface of a silicon substrate 60 is covered with a silicon nitride film 61, and thereon a SiO$_2$ film 62 is deposited under an ordinary condition by a CVD method. Furthermore, the following are formed thereon in turn: a first amorphous silicon layer 63, a second doped amorphous silicon film 64 and a third amorphous silicon layer 65. The impurity concentration in the first and third amorphous silicon layers is set to a value smaller than that of the second amorphous silicon layer. Subsequently, a SiO$_2$ film 66 is formed on the third amorphous silicon layer 65 under an ordinary condition by a CVD method (FIG. 5(a)). Next, openings are formed in such a manner that lower electrode-forming areas above the silicon substrate 60 are exposed (FIG. 5(b)). Thereafter, a first silicon layer, a second doped amorphous silicon layer and a third amorphous silicon layer are successively formed on the entire surface thereof (FIG. 5(c)). In this step, the impurity concentration in the first and the third amorphous silicon layers is set to a value smaller than that of the second amorphous silicon layer, in the same way as above. Next, the first, the second and the third amorphous silicon layers, and SiO$_2$ films 62 and 65 are patterned into a desired form, and then the SiO$_2$ 62 and 65 are etched and removed off. At last, HSG 67 is formed on the surfaces of the first and the third amorphous silicon layers, to finish a lower electrode of a capacitor (FIG. 5(d)).

In the lower electrodes of the stacked capacitors in these embodiments, the amorphous silicon film composed of fine hemispherical grain (HSG) is formed on their surfaces. The grain size of the HSG is preferably from 30 to 90 nm, and more preferably from 50 to 70 nm.

In the first amorphous silicon layer and the third amorphous silicon layer, their impurity concentration and film thickness are substantially the same. In this manner, the HSG film is uniformly formed on the whole surface of the electrode.

The first and the third amorphous silicon films function as a source for supplying silicon for growth of the HSG. They have at least lower impurity concentration than that in the second amorphous silicon layer. From the standpoint of preventing growth of the HSG from being blocked by crystallization so as to grow the HSG efficiently for a short time, the impurity concentration is preferably $1.5 \times 10^{20}$ atoms/cm$^3$ or less, and more preferably $1.0 \times 10^{20}$ atoms/cm$^3$ or less. From only the standpoint of preventing growth of the HSG from being blocked, a non-doped layer (the impurity concentration: about 0 atoms/cm3) is the most preferable. However, there are cases in which control of HSG growth rate is difficult dependently on growth conditions, and in these case it is preferred to contain the impurity within the aforementioned concentration range. As the impurity, phosphorus, arsenic, boron or the like is used.

The thickness of the first amorphous silicon layer and the third amorphous silicon layer is set to an appropriate value dependently on the set grain size of the HSG, but is preferably 5 nm or more and 25 nm or less. In this manner, it is possible to grow the HSG up to a sufficient size and avoid problems, for example, that a constriction of the HSG is generated in the interface of the HSG silicon and the amorphous silicon layer.

The impurity concentration of the second amorphous silicon layer is preferably $2.0 \times 10^{20}$ atoms/cm$^3$ or more and $8.0 \times 10^{20}$ atoms/cm$^3$ or less. By using such a concentration, it is possible to prevent depletion of the impurity in the HSG efficiently, and prevent non-uniform precipitation of phosphorus and blocking of HSG growth by crystallization of amorphous silicon.

As the method for forming HSG in the present invention, an annealing method or a selective HSG method or the like can be used. The annealing method at e.g., 500–600° C. is a method comprising the steps of optional treatment with HF, and subsequently annealing for an appropriate period to grow HSG. The selective HSG method is a method comprising the steps of optional treatment with HF, and subsequently irradiation with a silicon molecule beam such as silane, disilane or the like, thereby forming microcrystals, which will be nuclei for HSG growth, and growing the microcrystals, so as to grow HSG. In both of the methods, after growth of the HSG, thermal treatment is optionally conducted to diffuse an impurity into HSG.

Among these methods for forming HSG, the selective HSG method is preferred from the standpoint of easily controlling the density and the grain size of the HSG. In other words, in the method for producing a capacitor according to the present invention it is preferred to use the method of forming a non-doped amorphous silicon layer containing microcrystals which will be nuclei for HSG growth on at least one portion of the first amorphous silicon layer and at least portion of the third amorphous silicon layer, and subsequently annealing the resultant in a highly vacuumed chamber or in inactive atmosphere, thereby forming HSG. The non-doped amorphous silicon layer containing microcrystals which will be nuclei for HSG growth can be prepared by irradiation with silane, disilane, or the like.

As described above, according to the method for producing a capacitor of the present invention, it is possible to uniformly grow HSG up to a sufficient size and prevent HSG growth from being blocked by crystallization because the lower electrode is made into a three-layer structure composed of the first, the second and the third amorphous silicon layers and further the impurity concentration in the first and the third amorphous silicon layers is set to a value lower than that in the second doped amorphous silicon layer. Besides, it is possible to control the size and the density of HSG with high accuracy since the second amorphous silicon layer functions as a stopper of HSG growth. Furthermore, it is possible to overcome a problem that in case in which the first and the third amorphous silicon layers are consumed for HSG growth, the structure is made weak.

In addition, it is possible to avoid a problem in the prior art that HSG is damaged in etch back treatment because the aforementioned three-layer structure is formed before a stack is formed, for example, immediately after a trench is formed.

Furthermore, in a method for forming a silicon surface in the present invention, after the first amorphous silicon layer containing an impurity is formed, the second amorphous silicon layer having a lower impurity concentration than that in the first layer is formed on the first layer and then HSG is formed in the surface thereof, Thus, it is possible that the first amorphous silicon layer functions as a stopper of HSG growth, thereby controlling the size and the density of the HSG with high accuracy.

What is claimed is:

1. A method for producing a capacitor comprising the steps of:

forming a first amorphous silicon layer to connect to a lower electrode forming area on a semiconductor substrate;

forming a second amorphous silicon layer on the first amorphous silicon layer;

forming a third amorphous silicon layer on the second amorphous silicon layer;

etching a portion of the first amorphous silicon layer and a portion of the third amorphous silicon layer to expose them;

forming fine, hemispherical grain (HSG) on surfaces of the first amorphous silicon layer and the third amorphous silicon layer; and diffusing an impurity into the HSG by annealing, thereby forming a lower electrode, wherein the HSG forming step comprises a step of irradiating the first amorphous silicon layer and the third amorphous silicon layer with a silicon molecule beam, and a step of annealing.

2. The method for producing a capacitor according to claim 1, wherein the first amorphous silicon layer and the third amorphous silicon layer are formed so that their impurity concentration is lower than the impurity concentration in the second amorphous silicon layer.

3. The method for producing a capacitor according to claim 2, wherein the film thickness and the impurity concentration of the first amorphous silicon layer are substantially the same as those of the third amorphous silicon layer.

4. The method for producing a capacitor according to claim 1, wherein the HSG forming step comprises the step of forming a non-doped amorphous silicon layer containing microcrystals which will be nuclei for HSG growth on the surfaces of the first amorphous silicon layer and the third amorphous silicon layer, and step of annealing.

5. A method for fabricating a capacitor comprising:

forming an internal insulating layer above a semiconductor substrate;

forming a first insulating layer on said internal insulating layer;

forming a doped insulating layer on said first insulating layer;

forming a non doped insulating layer on said doped insulating layer;

selectively removing a predetermined part of said non-doped insulating layer, said doped insulating layer and first insulating layer, and exposing a surface of said internal insulating layer in order to form an opening;

forming a first layer of amorphous silicon on a side of said opening and a bottom of said opening;

forming a second layer of doped amorphous silicon on said first silicon layer;

forming a third layer of amorphous silicon on said second silicon layer;

forming a fourth layer on said third layer to fill up said opening;

removing said first, second, third and fourth layers except for said first, second, third and fourth layers formed in said opening, and while leaving said non-doped silicon layer;

removing said fourth layer, said non-doped silicon layer, said doped silicon layer, said first insulating layer, and said fourth layer formed in said opening in order to leave said first, second, and third layers having a cylindrical shape;

forming a hemi spherical, grain (HSG) on said first and third layers; and diffusing an impurity within said second layer to said HSG of said first and third layers.

6. The method as claimed in claim 5, wherein said first and third layers have from 5 nm to 25 nm thickness.

7. The method as claimed in claim 6, wherein said second layer have an impurity density being from $2*10^{20}$ atoms/cm$^3$ to $8*10^{20}$ atoms/cm$^3$.

8. The method as claimed in claim 7, wherein said first and third layers have an impurity density being less than $1.5*10^{20}$ atoms/cm$^3$.

9. The method as claimed in claim 5, further comprising forming a dielectric layer on said first and third layers.

10. The method as claimed in claim 5, further comprising forming a dielectric nitride layer on said first and third layers, and exchanging a surface of said nitride layer to an oxide layer by pyrogenic oxidization.

11. The method as claimed in claim 5, wherein said selectively removing step exposes a surface of a contact plug formed in said internal insulating layer.

12. A method for fabricating a capacitor comprising:

forming an internal insulating layer above a semiconductor substrate;

forming a non-doped insulating layer on said internal insulating layer;

forming a conductive layer on said first non-doped insulating layer;

forming a doped insulating layer on said internal insulating layer;

selectively removing first and second parts of said doped insulating layer, and said conductive layer, and leaving a third part between said first and second parts of said doped insulating layer, and said conductive layer;

forming a first layer of amorphous silicon on a surface of said doped insulating layer and a surface of said conductive layer;

forming a second layer of doped amorphous silicon on said first layer;

forming a third layer of amorphous silicon on said second layer;

removing said first, second, and third layers except for that formed on a side surface of said doped insulating layer and said conductive layer, and while leaving said non-doped insulating layer;

removing a remaining portion of said doped insulating layer;

forming a hemi spherical grain (HSG) on said first and third layers; and diffusing an impurity within said second layer to said HSG of said first and third layers.

13. The method as claimed in claim 12, wherein said first and third layers have from 5 nm to 25 nm thickness.

14. The method as claimed in claim 13, wherein said second layer have an impurity density being from $2*10^{20}$ atoms/cm$^3$ to $8*10^{20}$ atoms/cm$^3$.

15. The method as claimed in claim 14, wherein said first and third layers have an impurity density being less than $1.5*10^{20}$ atoms/cm$^3$.

16. The method as claimed in claim 12, further comprising forming a dielectric layer on said first and third layers.

17. The method as claimed in claim 12, further comprising forming a dielectric nitride layer on said first and third layers, and exchanging a surface of said nitride layer to an oxide layer by pyrogenic oxidization.

18. The method as claims in claim 12, wherein said forming conductive layer includes a step filling up an opening formed in said internal insulating layer and said non-doped insulating layer to make a contact plug in said opening.

19. A method for fabricating a capacitor having a fin shape comprising:

forming a first insulating layer on a semiconductor substrate;

forming a second insulating layer of a predetermined material different from said first insulating layer on said first insulating layer;

forming a first layer of amorphous silicon on said second insulating layer;

forming a second layer of doped amorphous silicon on said first layer;

forming a third layer of amorphous silicon on said second layer;

forming a third insulating layer of said predetermined material on said third layer;

forming an opening to expose a surface of said semiconductor substrate;

forming a fourth layer of amorphous silicon on said third insulating layer and a side surface and a bottom of said opening;

forming a fifth layer of doped amorphous silicon on said fourth layer;

forming a sixth layer of amorphous silicon on said fifth layer;

removing said second insulating layer and said third insulating layer;

forming a hemi spherical grain (HSG) on said first, third, fourth, and sixth layers; and diffusing an impurity within said second layer to said HSG of said first and third layers, and an impurity of said fifth layer to said HSG of fourth and sixth layers.

20. A method for fabricating a capacitor comprising:

forming a first amorphous silicon of about 60 nm thickness above a semiconductor substrate and said first amorphous silicon having an impurity density of $2*10^{20}$ atom/cm$^3$ to $8*10^{20}$ atoms/cm$^3$;

forming a second amorphous silicon of 5 nm to 25 nm thickness on said first amorphous silicon, said second amorphous silicon having an impurity density less than $1.5*10^{20}$ atoms/cm$^3$;

changing a part of said second amorphous silicon to a hemi spherical grain (HSG); and annealing said first and second amorphous silicon to diffuse an impurity within said first amorphous silicon into said second amorphous silicon and said HSG.

21. The method as claimed in claim 18, wherein said impurity is phosphorous.

22. A method fabricating a capacitor having a cylindrical shape comprising:

forming an internal insulating layer above a semiconductor substrate;

forming an opening to said internal insulating layer to expose a conductive layer;

forming a first layer of amorphous silicon on a side surface and bottom of said opening, said first layer connected to said conductive layer;

forming a second layer of doped amorphous silicon on said first layer;

forming a third layer of amorphous silicon on said second layer;

removing said first, second and third layers except said first, second and third layers formed in said opening;

removing said internal insulating layer to form a cylindrical shape electrode formed by said first, second and third layers;

changing a part of said first and third layers to a hemi spherical grain (HSG); and annealing said first, second and third layer to diffuse an impurity within said second layer into said first and third layers and said HSG.

* * * * *